US007300815B2

(12) United States Patent
Tam et al.

(10) Patent No.: US 7,300,815 B2
(45) Date of Patent: Nov. 27, 2007

(54) METHOD FOR FABRICATING A GOLD CONTACT ON A MICROSWITCH

(75) Inventors: Gordon Tam, Gilbert, AZ (US); Jun Shen, Phoenix, AZ (US)

(73) Assignee: Schneider Electric Industries SAS (FR)

( * ) Notice: Subject to any disclaimer, the term of this patent is extended or adjusted under 35 U.S.C. 154(b) by 0 days.

(21) Appl. No.: 11/113,344

(22) Filed: Apr. 25, 2005

(65) Prior Publication Data

US 2006/0084252 A1 Apr. 20, 2006

Related U.S. Application Data

(63) Continuation of application No. 10/673,546, filed on Sep. 30, 2003, now abandoned.

(60) Provisional application No. 60/414,361, filed on Sep. 30, 2002.

(51) Int. Cl.
*H01L 21/441* (2006.01)

(52) U.S. Cl. ........................ 438/52; 438/686; 257/418; 257/E21.161; 200/181

(58) Field of Classification Search .................. 438/52, 438/686; 257/417, 418, E21.161; 200/181
See application file for complete search history.

(56) References Cited

U.S. PATENT DOCUMENTS

| | | | | |
|---|---|---|---|---|
| 4,065,677 A | | 12/1977 | Micheron et al. | |
| 4,461,968 A | | 7/1984 | Kolm et al. | |
| 4,496,211 A | | 1/1985 | Daniel | |
| 4,570,139 A | | 2/1986 | Kroll | |
| 5,016,978 A | | 5/1991 | Fargette et al. | |
| 5,048,912 A | | 9/1991 | Kunikane et al. | |
| 5,398,011 A | | 3/1995 | Kimura et al. | |
| 5,472,539 A | | 12/1995 | Saia et al. | |
| 5,475,353 A | | 12/1995 | Roshen et al. | |
| 5,557,132 A | | 9/1996 | Takahashi | |
| 5,578,976 A | * | 11/1996 | Yao | 333/262 |
| 5,629,918 A | | 5/1997 | Ho et al. | |

(Continued)

FOREIGN PATENT DOCUMENTS

DE 19820821 C1 12/1999

(Continued)

OTHER PUBLICATIONS

Richard P. Feymann, "There's Plenty of Room at the Bottom", Dec. 29, 1959, pp. 1-12, Internet Source: http://222.zyvex.com/nanotech/feynman.html.

(Continued)

*Primary Examiner*—B. William Baumeister
*Assistant Examiner*—Steven J. Fulk
(74) *Attorney, Agent, or Firm*—Sterne, Kessler, Goldstein & Fox PLLC

(57) ABSTRACT

Described is a process to pattern adhesion and top contact layers in such a way that at least some portion of the top contact layers overlaps the adhesion layer, while another portion of the top contact layer overlaps with the bottom contacts, but does not overlap with the adhesion layer. The overlap between the top contact layer and the adhesion layer helps to hold the top contact layer onto the sacrificial layer. Because there is no overlap between the adhesion layer and the bottom contact, the removal of adhesion layer is no longer necessary, leading to better contacts and simplifying the fabrication process.

11 Claims, 15 Drawing Sheets

U.S. PATENT DOCUMENTS

| | | | | |
|---|---|---|---|---|
| 5,696,619 | A | 12/1997 | Knipe et al. | |
| 5,784,190 | A | 7/1998 | Worley | |
| 5,818,316 | A | 10/1998 | Shen et al. | |
| 5,838,847 | A | 11/1998 | Pan et al. | |
| 5,847,631 | A | 12/1998 | Taylor et al. | |
| 5,898,515 | A | 4/1999 | Furlani et al. | |
| 5,945,898 | A | 8/1999 | Judy et al. | |
| 5,982,554 | A | 11/1999 | Goldstein et al. | |
| 6,016,092 | A | 1/2000 | Qiu et al. | |
| 6,016,095 | A | 1/2000 | Herbert | |
| 6,028,689 | A | 2/2000 | Michalicek et al. | |
| 6,078,016 | A | 6/2000 | Yoshikawa et al. | |
| 6,084,281 | A | 7/2000 | Fullin et al. | |
| 6,094,116 | A | 7/2000 | Tai et al. | |
| 6,094,293 | A | 7/2000 | Yokoyama et al. | |
| 6,115,231 | A | 9/2000 | Shirakawa | |
| 6,124,650 | A | 9/2000 | Bishop et al. | |
| 6,127,908 | A | 10/2000 | Bozler et al. | |
| 6,143,997 | A | 11/2000 | Feng et al. | |
| 6,160,230 | A | 12/2000 | McMillen et al. | |
| 6,440,767 | B1 | 8/2002 | Loo et al. | |
| 6,469,603 | B1 | 10/2002 | Ruan et al. | |
| 6,495,892 | B2 | 12/2002 | Goodman et al. | |
| 6,512,432 | B2 | 1/2003 | Suzuki | |
| 6,535,091 | B2 * | 3/2003 | Bechtle et al. | 333/262 |
| 6,633,212 | B1 * | 10/2003 | Ruan et al. | 335/78 |
| 6,750,745 | B1 | 6/2004 | Wei et al. | |
| 6,812,814 | B2 * | 11/2004 | Ma et al. | 333/262 |
| 6,917,086 | B2 * | 7/2005 | Cunningham et al. | 257/415 |
| 2002/0118084 | A1 | 8/2002 | Lim et al. | |
| 2002/0185712 | A1 | 12/2002 | Stark et al. | |
| 2002/0196110 | A1 | 12/2002 | Vaitkus et al. | |
| 2003/0116417 | A1 * | 6/2003 | DeReus | 200/181 |
| 2003/0179058 | A1 | 9/2003 | Vaitkus et al. | |
| 2004/0121505 | A1 | 6/2004 | Tam et al. | |
| 2005/0285703 | A1 | 12/2005 | Wheeler et al. | |

FOREIGN PATENT DOCUMENTS

| | | | |
|---|---|---|---|
| DE | 10031569 | A1 | 2/2001 |
| EP | 0452012 | A2 | 10/1991 |
| EP | 0452012 | A3 | 10/1991 |
| EP | 0685864 | A1 | 12/1995 |
| EP | 0709911 | A2 | 5/1996 |
| EP | 0709911 | A3 | 5/1996 |
| EP | 0780858 | A1 | 6/1997 |
| EP | 0869519 | A1 | 10/1998 |
| EP | 0887879 | A1 | 12/1998 |
| FR | 2572546 | A1 | 5/1986 |
| JP | 54-161952 | A | 12/1979 |
| JP | 4-275519 | A | 10/1992 |
| JP | 6-251684 | A | 9/1994 |
| WO | WO 97/39468 | A1 | 10/1997 |
| WO | WO 98/34269 | A1 | 8/1998 |
| WO | WO 99/27548 | A1 | 6/1999 |
| WO | WO 01/57899 | A1 | 8/2001 |
| WO | WO 01/84211 | A2 | 11/2001 |

OTHER PUBLICATIONS

E. Fullin, J. Gobet, H.A.C. Tilmans, and J. Bergvist,"A New Basic Technology for Magnetic Micro-Actuators", pp. 143-147.

Jack W. Judy and Richard S. Muller "Magnetically Actuated, Addressable Microstructures", Sep. 1997, Journal of Microelectromechanical Systems, vol. 6, No. 3, Sep. 1997, pp. 249-255.

Ezekiel JJ Kruglick and Kristofer SJ Pister, "Project Overview: Micro-Relays", Tech. Digital Solid-State Sensor and Actuator Workshop, 1998, Hilton Head 98 and 19th International Conference on Electric Contact Phenomena, Nuremberg, Germany, Sep. 1998 (Downloaded from Internet Source: http://www-bsac.eecs.berkeley.edu/Kruglick/relays/relays.html on Jul. 12, 1999) 2 pgs.

Ezekiel J.J. Kruglick and Kristofer S.J. Pister, "Bistable MEMS Relays and Contact Characterization", Tech. Digital Solid-State Sensor and Actuator Workshop, Hilton Head, 1988 and 19th International Conference on Electric Contact Phenomena, Nuremberg, Germany, Sep. 1998, 5 pgs.

Laure K. Lagorce and Oliver Brand, "Magnetic Microactuators Based on Polymer Magnets", Mar. 1999, IEEE Journal of Microelectromechanical Systems, IEEE, vol. 8., No. 1., Mar. 1999, 8 pages.

"P10D Electricity & Magnetism Lecture 14", Internet Source: http://scitec.uwhichill.odu.bb/cmp/online/P10D/Lecture14/lect14.htn, Jan. 3, 2000, pp. 1-5.

"Ultraminiature Magnetic Latching to 5-relays SPDT DC TO C Band", Series RF 341, product information from Teledyne Relays, 1998.

M. Ruan et al., "Latching Microelectromagnetic Relays", Sensors and Actuators A 91 (Jul. 15, 2001), Copyright 2001 Elsevier Science B.V., pp. 346-350.

Xi-Qing Sun, K.R. Farmer, W.N. Carr, "A Bistable Microrelay Based on Two-Segment Multimorph Cantilever Actuators", 11th Annual Workshop on Micro Electrical Mechanical Systems, Heidelberg, Germany, IEEE, Jan. 25-29, 1998, pp. 154-159.

William P. Taylor and Mark G. Allen, "Integrated Magnetic Microrelays: Normally Open, Normally Closed, and Multi-Pole Devices", 1997 International Conference on Solid-State Sensors and Actuators, IEEE, Jun. 16-19, 1997, pp. 1149-1152.

William P. Taylor, Oliver Brand, and Mark G. Allen. "Fully Integrated Magnetically Actuated Micromachined Relays", Journal of Microelectromechanical Systems, IEEE, vol. 7, No. 2, Jun. 1998, pp. 181-191.

Tilmans, et al., "A Fully-Packaged Electromagnetic Microrelay", Proc. MEMS '99, Orlando, FL, Jan. 17-21, 1999, copyright IEEE 1999, pp. 25-30.

William Trimmer, "The Scaling of Micromechanical Devices", Internet Source: http://home.earthlink.net/-trimmerw/mems/scale.html on Jan. 3, 2000 (adapted from article Microrobots and Micromechanical Systems by W.S.N. Trimmer, Sensors and Actuators, vol. 19, No. 3, Sep. 1989, pp. 267-287, and other sources).

John A. Wright, Yu-Chong Tai, "Micro-Miniature Electromagnetic Switches Fabricated Using MEMS Technology", Proceedings: 46th Annual International Relay Conference: NARM '98, Apr. 1998, pp. 13-1 to 13-4.

John A. Wright, Yu-Chong Tai and Gerald Lilienthal, "A Magnetostatic MEMS Switch for DC Brushless Motor Commutation", Proceedings Solid State Sensor and Actuator Workshop, Hilton Head, 1998, Jun. 1998, pp. 304-307.

John A. Wright, Yu-Chong Tai, and Shih-Chia Chang, "A Large-Force, Fully-Integrated MEMS Magnetic Actuator", Tranducers '97, 1997 International Conference on Solid State Sensors and Actuators, Chicago, Jun. 16-19, 1997.

Ann, Chong H. & Allen, Mark G., A Fully Integrated Micromagnetic Actuator With A Multilevel Meander Magnetic Core, 1992 IEEE, Solid-State Sensor and Actuator Workshop, Technical Digest, Hilton Head Island, South Carolina, Jun. 22-25, 1992, Technical Digest, pp. 14-17.

* cited by examiner

METHOD FOR FABRICATING A GOLD CONTACT ON A MICROSWITCH

CROSS-REFERENCE TO RELATED APPLICATIONS

This application is a continuation of U.S. application Ser. No. 10/673,546, filed Sep. 30, 2003, which claims the benefit of U.S. Provisional Application No. 60/414,361, filed Sep. 30, 2002, which is incorporated herein in its entirety by reference.

BACKGROUND OF THE INVENTION

1. Field of the Invention

The present invention relates to electronic and optical switches. More specifically, the present invention relates to a method to fabricate micro switch contacts.

2. Related Art

Switches are typically electrically controlled two-state devices that open and close contacts to effect operation of devices in an electrical or optical circuit. Relays, for example, typically function as switches that activate or de-activate portions of electrical, optical or other devices. Relays are commonly used in many applications including telecommunications, radio frequency (RF) communications, portable electronics, consumer and industrial electronics, aerospace, and other systems. More recently, optical switches (also referred to as “optical relays” or simply “relays” herein) have been used to switch optical signals (such as those in optical communication systems) from one path to another.

Although the earliest relays were mechanical or solid-state devices, recent developments in micro-electro-mechanical systems (MEMS) technologies and microelectronics manufacturing have made micro-electrostatic and micro-magnetic relays possible. Such micro-magnetic relays typically include an electromagnet that energizes an armature to make or break an electrical contact. When the magnet is de-energized, a spring or other mechanical force typically restores the armature to a quiescent position. Such relays typically exhibit a number of marked disadvantages, however, in that they generally exhibit only a single stable output (i.e., the quiescent state) and they are not latching (i.e., they do not retain a constant output as power is removed from the relay). Moreover, the spring required by conventional micro-magnetic relays may degrade or break over time.

Non-latching micro-magnetic relays are known. The relay includes a permanent magnet and an electromagnet for generating a magnetic field that intermittently opposes the field generated by the permanent magnet. The relay must consume power in the electromagnet to maintain at least one of the output states. Moreover, the power required to generate the opposing field would be significant, thus making the relay less desirable for use in space, portable electronics, and other applications that demand low power consumption.

The basic elements of a latching micro-magnetic switch include a permanent magnet, a substrate, a coil, and a cantilever at least partially made of soft magnetic materials. In its optimal configuration, the permanent magnet produces a static magnetic field that is relatively perpendicular to the horizontal plane of the cantilever. However, the magnetic field lines produced by a permanent magnet with a typical regular shape (disk, square, etc.) are not necessarily perpendicular to a plane, especially at the edge of the magnet. Then, any horizontal component of the magnetic field due to the permanent magnet can either eliminate one of the bistable states, or greatly increase the current that is needed to switch the cantilever from one state to the other. Careful alignment of the permanent magnet relative to the cantilever so as to locate the cantilever in the right spot of the permanent magnet field (usually near the center) will permit bi-stability and minimize switching current. Nevertheless, high-volume production of the switch can become difficult and costly if the alignment error tolerance is small.

Although various designs and fabrication processes of making micro switches have been previously disclosed, to fabricate a good micro switch (e.g., a micro magnetic latching switch), electrical contacts with low contact resistance and high reliability is desired. To form a pair of contacts that can be opened and closed, the following process is typically used: (1) a bottom fixed contact is first formed, (2) a sacrificial layer is then deposited, (3) a top contact pad above the bottom contact is deposited and patterned on the sacrificial layer, (4) a cantilever connecting to the top contact is formed, and (5) the sacrificial layer is removed to release the cantilever. Of course, various actuation components (e.g., coils, mechanical torsion supports, etc.) are also fabricated before or after. The cantilever can move up and down to break and make the contact with the bottom contact pad. Typically, gold (Au) (or another good conducting metal) is used to form the bottom and top contact pads. Typical sacrificial layers are: polyimide, silicon dioxide ($SiO_2$), photoresist, etc. However, suitable contact metal layers (e.g., Au) do not adhere to the typical sacrificial layers very well. Thus, an intermediate adhesion layer (e.g., chromium (Cr), titanium (Ti), etc.) has often been used between the contact metal (e.g., Au) and the sacrificial layer (polyimide, $SiO_2$, photoresist, etc.). In this case, the adhesion layer needs to be removed completely (wet or dry etched) after the sacrificial layer removal. In reality, the complete adhesion layer removal is often difficult. The remnant adhesion layer often leads to high contact resistance, unacceptable to many applications. Also, the chemical agents being used to remove the adhesion layer can attack other elements (cantilever, coil, contact, etc.) in the switch, destroying the integrity of the switch structure.

Thus, a simple method that overcomes the above-mentioned problems is desired.

SUMMARY OF THE INVENTION

The present invention comprises a method for fabricating gold contacts on a microswitch. The present invention provides a process to pattern adhesion and top contact layers in such a way that at least some portion of the top contact layers overlaps the adhesion layer, while another portion of the top contact layer overlaps with the bottom contacts, but does not overlap with the adhesion layer. The overlap between the top contact layer and the adhesion layer helps to hold the top contact layer onto the sacrificial layer. Because there is no overlap between the adhesion layer and the bottom contact, the removal of adhesion layer is no longer necessary, leading to better contacts and simplifying the fabrication process.

These and other objects, advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figures 1A, 1B:
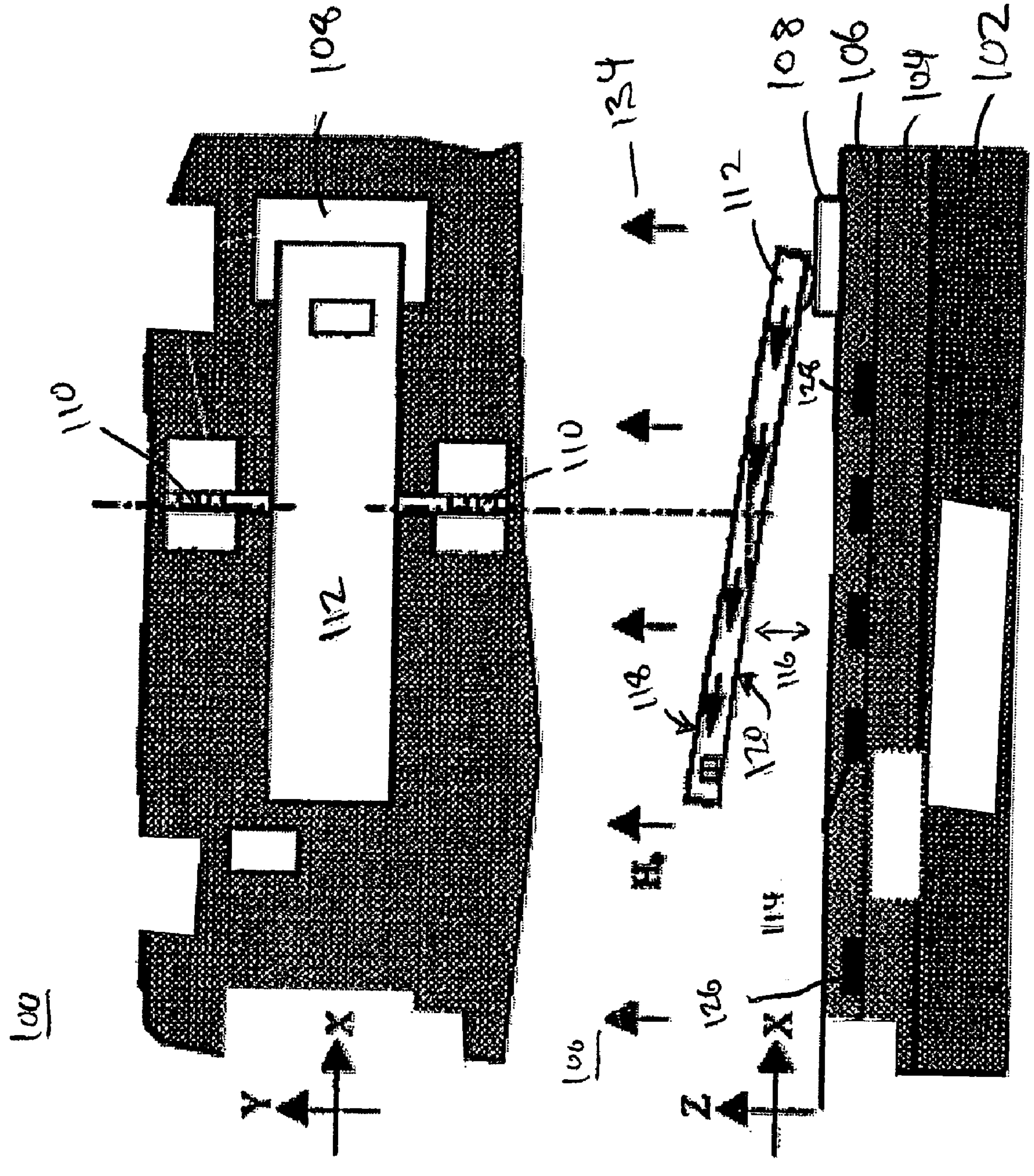
FIGS. 1A and 1B are side and top views, respectively, of an exemplary embodiment of a switch.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, MEMS technologies, and other functional aspects of the systems (and components of the individual operating components of the systems) may not be described in detail herein. Furthermore, for purposes of brevity, the invention is frequently described herein as pertaining to a micro-electro-mechanical relay for use in electrical or electronic systems. It should be appreciated that many other manufacturing techniques could be used to create the relays described herein, and that the techniques described herein could be used in mechanical relays, optical relays or any other switching device. Further, the techniques would be suitable for application in electrical systems, optical systems, consumer electronics, industrial electronics, wireless systems, space applications, or any other application.

The terms, chip, integrated circuit, monolithic device, semiconductor device, and microelectronic device, are often used interchangeably in this field. The present invention is applicable to all the above as they are generally understood in the field.

The terms metal line, transmission line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term vertical, as used herein, means substantially orthogonal to the surface of a substrate. Moreover, it should be understood that the spatial descriptions (e.g., “above”, “below”, “up”, “down”, “top”, “bottom”, etc.) made herein are for purposes of illustration only, and that practical latching relays can be spatially arranged in any orientation or manner.

The above-described micro-magnetic latching switch is further described in international patent publications WO0157899 (titled Electronically Switching Latching Micro-magnetic Relay And Method of Operating Same), and WO0184211 (titled Electronically Micro-magnetic latching switches and Method of Operating Same), to Shen et al. These patent publications provide a thorough background on micro-magnetic latching switches and are incorporated herein by reference in their entirety. Moreover, the details of the switches disclosed in WO0157899 and WO0184211 are applicable to implement the switch embodiments of the present invention as described below.

Overview of a Latching Switch

FIGS. 1A and 1B show side and top views, respectively, of a latching switch. The terms switch and device are used herein interchangeably to describe the structure of the present invention. With reference to FIGS. 1A and 1B, an exemplary latching relay 100 suitably includes a magnet 102, a substrate 104, an insulating layer 106 housing a conductor 114, a contact 108 and a cantilever (moveable element) 112 positioned or supported above substrate by a staging layer 110.

Magnet 102 is any type of magnet such as a permanent magnet, an electromagnet, or any other type of magnet capable of generating a magnetic field $H_0$ 134, as described more fully below. By way of example and not limitation, the magnet 102 can be a model 59-P09213T001 magnet available from the Dexter Magnetic Technologies corporation of Fremont, Calif., although of course other types of magnets could be used. Magnetic field 134 can be generated in any manner and with any magnitude, such as from about 1 Oersted to $10^4$ Oersted or more. The strength of the field depends on the force required to hold the cantilever in a given state, and thus is implementation dependent. In the exemplary embodiment shown in FIG. 1A, magnetic field $H_0$ 134 can be generated approximately parallel to the Z axis and with a magnitude on the order of about 370 Oersted, although other embodiments will use varying orientations and magnitudes for magnetic field 134. In various embodiments, a single magnet 102 can be used in conjunction with a number of relays 100 sharing a common substrate 104.

Substrate 104 is formed of any type of substrate material such as silicon, gallium arsenide, glass, plastic, metal or any other substrate material. In various embodiments, substrate 104 can be coated with an insulating material (such as an oxide) and planarized or otherwise made flat. In various embodiments, a number of latching relays 100 can share a single substrate 104. Alternatively, other devices (such as transistors, diodes, or other electronic devices) could be formed upon substrate 104 along with one or more relays 100 using, for example, conventional integrated circuit manufacturing techniques. Alternatively, magnet 102 could be used as a substrate and the additional components discussed below could be formed directly on magnet 102. In such embodiments, a separate substrate 104 may not be required.

Insulating layer 106 is formed of any material such as oxide or another insulator such as a thin-film insulator. In an exemplary embodiment, insulating layer is formed of Polyimide material. Insulating layer 106 suitably houses conductor 114. Conductor 114 is shown in FIGS. 1A and 1B to be a single conductor having two ends 126 and 128 arranged in a coil pattern. Alternate embodiments of conductor 114 use single or multiple conducting segments arranged in any suitable pattern such as a meander pattern, a serpentine pattern, a random pattern, or any other pattern. Conductor 114 is formed of any material capable of conducting electricity such as gold, silver, copper, aluminum, metal or the like. As conductor 114 conducts electricity, a magnetic field is generated around conductor 114 as discussed more fully below.

Cantilever (moveable element) 112 is any armature, extension, outcropping or member that is capable of being affected by magnetic force. In the embodiment shown in FIG. 1A, cantilever 112 suitably includes a magnetic layer 118 and a conducting layer 120. Magnetic layer 118 can be formulated of permalloy (such as NiFe alloy) or any other magnetically sensitive material. Conducting layer 120 can be formulated of gold, silver, copper, aluminum, metal or any other conducting material. In various embodiments, cantilever 112 exhibits two states corresponding to whether relay 100 is "open" or "closed", as described more fully below. In many embodiments, relay 100 is said to be "closed" when a conducting layer 120, connects staging layer 110 to contact 108. Conversely, the relay may be said to be "open" when cantilever 112 is not in electrical contact with contact 108. Because cantilever 112 can physically move in and out of contact with contact 108, various embodiments of cantilever 112 will be made flexible so that cantilever 112 can bend as appropriate. Flexibility can be created by varying the thickness of the cantilever (or its various component layers), by patterning or otherwise making holes or cuts in the cantilever, or by using increasingly flexible materials.

Alternatively, cantilever 112 can be made into a "hinged" arrangement. Although of course the dimensions of cantilever 112 can vary dramatically from implementation to implementation, an exemplary cantilever 112 suitable for use in a micro-magnetic relay 100 can be on the order of 10-1000 microns in length, 1-40 microns in thickness, and 2-600 microns in width. For example, an exemplary cantilever in accordance with the embodiment shown in FIGS. 1A and 1B can have dimensions of about 600 microns×10 microns×50 microns, or 1000 microns×600 microns×25 microns, or any other suitable dimensions.

Figure 2B:
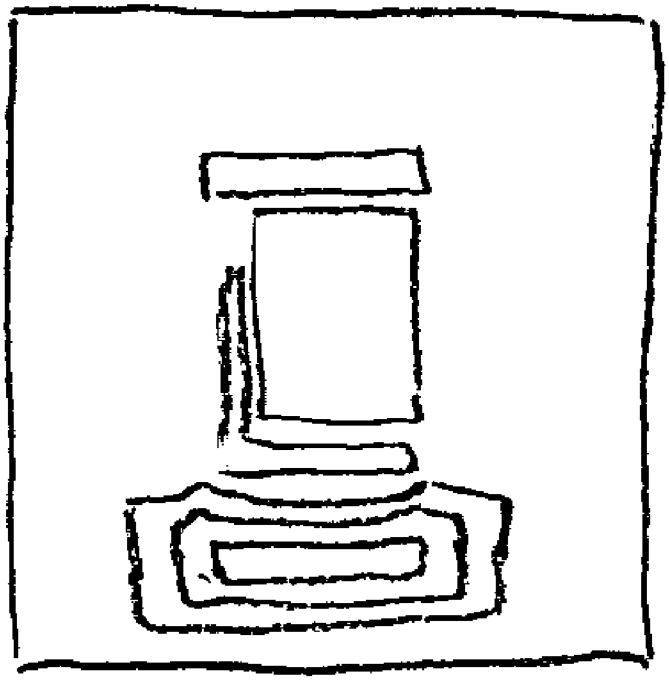
FIGS. 2A and 2B are micrograph illustrations of microswitches of the present invention.
Figure 2A:
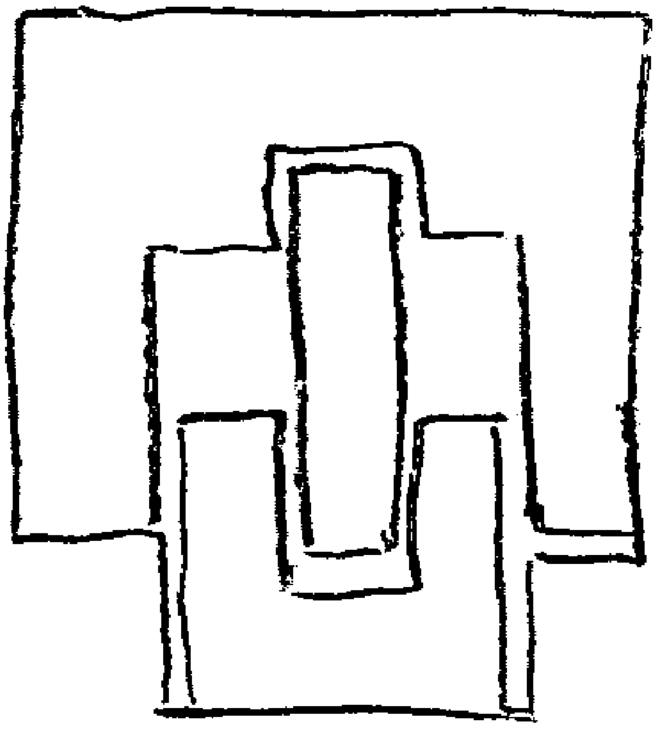

Contact 108 and staging layer 110 are placed on insulating layer 106, as appropriate. In various embodiments, staging layer 110 supports cantilever 112 above insulating layer 106, creating a gap 116 that can be vacuum or can become filled with air or another gas or liquid such as oil. Although the size of gap 116 varies widely with different implementations, an exemplary gap 116 can be on the order of 1-100 microns, such as about 20 microns. Contact 108 can receive cantilever 112 when relay 100 is in a closed state, as described below. Contact 108 and staging layer 110 can be formed of any conducting material such as gold, gold alloy, silver, copper, aluminum, metal, or the like. In various embodiments, contact 108 and staging layer 110 are formed of similar conducting materials, and the relay is considered to be "closed" when cantilever 112 completes a circuit between staging layer 110 and contact 108. In certain embodiments wherein cantilever 112 does not conduct electricity, staging layer 110 can be formulated of non-conducting material such as Polyimide material, oxide, or any other material. Additionally, alternate embodiments may not require staging layer 110 if cantilever 112 is otherwise supported above insulating layer 106. FIGS. 2A and 2B are micrograph illustrations of microswitches of the present invention.

Principle of Operation of a Micro-Magnetic Latching Switch

When it is in the "down" position, the cantilever makes electrical contact with the bottom conductor, and the switch is "on" (also called the "closed" state). When the contact end is "up", the switch is "off" (also called the "open" state). These two stable states produce the switching function by the moveable cantilever element. The permanent magnet holds the cantilever in either the "up" or the "down" position after switching, making the device a latching relay. A current is passed through the coil (e.g., the coil is energized) only during a brief (temporary) period of time to transition between the two states.

(i) Method to Produce Bi-Stability

Figure 3:
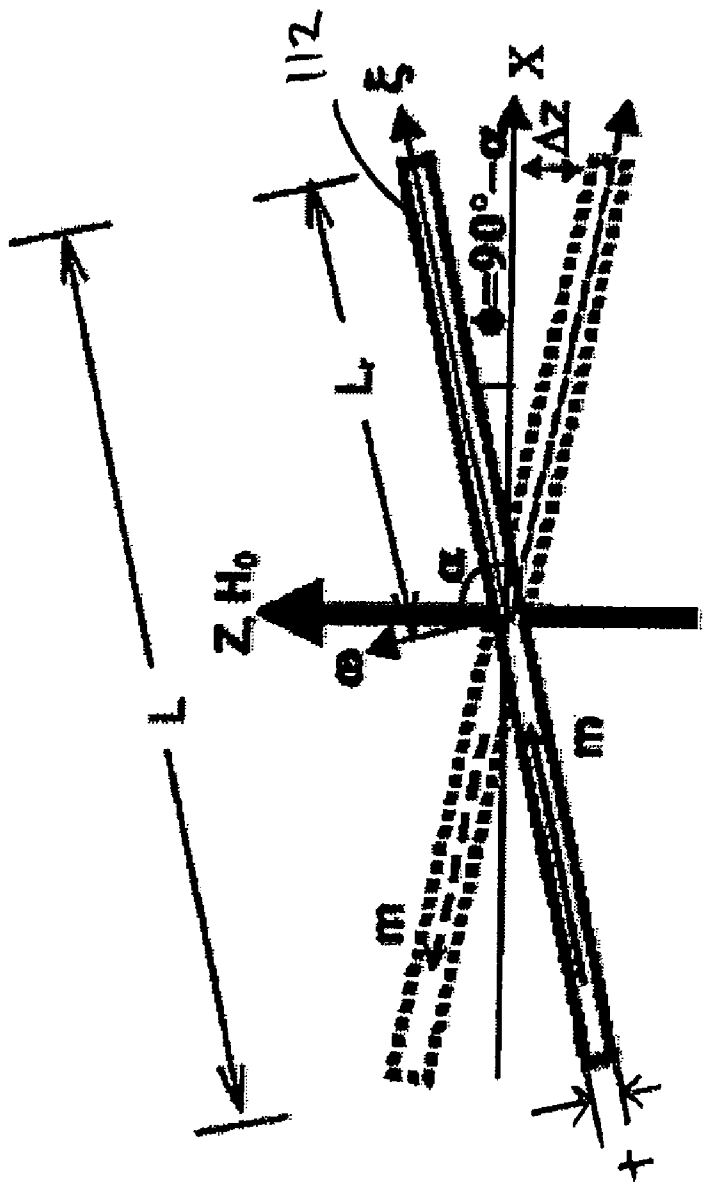
FIG. 3 illustrates the principle by which bi-stability is produced.

The principle by which bi-stability is produced is illustrated with reference to FIG. 3. When the length L of a permalloy cantilever 112 is much larger than its thickness t and width (w, not shown), the direction along its long axis L becomes the preferred direction for magnetization (also called the "easy axis"). When a major central portion of the cantilever is placed in a uniform permanent magnetic field, a torque is exerted on the cantilever. The torque can be either clockwise or counterclockwise, depending on the initial orientation of the cantilever with respect to the magnetic field. When the angle (∀) between the cantilever axis (>) and the external field ($H_0$) is smaller than 90E, the torque is counterclockwise; and when ∀ is larger than 90E, the torque is clockwise. The bi-directional torque arises because of the bi-directional magnetization (i.e., a magnetization vector "m" points one direction or the other direction, as shown in FIG. 3) of the cantilever (m points from left to right when ∀<90E, and from right to left when ∀>90E). Due to the torque, the cantilever tends to align with the external magnetic field ($H_0$). However, when a mechanical force (such as the elastic torque of the cantilever, a physical stopper, etc.) preempts to the total realignment with $H_0$, two stable positions ("up" and "down") are available, which forms the basis of latching in the switch.

(ii) Electrical Switching

If the bi-directional magnetization along the easy axis of the cantilever arising from $H_0$ can be momentarily reversed by applying a second magnetic field to overcome the influence of ($H_0$), then it is possible to achieve a switchable latching relay. This scenario is realized by situating a planar coil under or over the cantilever to produce the required temporary switching field. The planar coil geometry was chosen because it is relatively simple to fabricate, though other structures (such as a wrap-around, three dimensional type) are also possible. The magnetic field (Hcoil) lines generated by a short current pulse loop around the coil. It is mainly the >-component (along the cantilever, see FIG. 3) of this field that is used to reorient the magnetization (magnetization vector "m") in the cantilever. The direction of the coil current determines whether a positive or a negative >-field component is generated. Plural coils can be used. After switching, the permanent magnetic field holds the cantilever in this state until the next switching event is encountered. Since the >-component of the coil-generated field (Hcoil->) only needs to be momentarily larger than the >-component ($H_0$>~$H_0$ cos(∀)=$H_0$ sin(N), ∀=90E−N) of the permanent magnetic field and N is typically very small (e.g., N.5E), switching current and power can be very low, which is an important consideration in micro relay design.

The operation principle can be summarized as follows: a permalloy cantilever in a uniform (in practice, the field can be just approximately uniform) magnetic field can have a clockwise or a counterclockwise torque depending on the angle between its long axis (easy axis, L) and the field. Two bi-stable states are possible when other forces can balance the torque. A coil can generate a momentary magnetic field to switch the orientation of magnetization (vector m) along the cantilever and thus switch the cantilever between the two states.

Relaxed Alignment of Magnets

To address the issue of relaxing the magnet alignment requirement, the inventors have developed a technique to create perpendicular magnetic fields in a relatively large region around the cantilever. The invention is based on the fact that the magnetic field lines in a low permeability media (e.g., air) are basically perpendicular to the surface of a very high permeability material (e.g., materials that are easily magnetized, such as permalloy). When the cantilever is placed in proximity to such a surface and the cantilever's horizontal plane is parallel to the surface of the high permeability material, the above stated objectives can be at least partially achieved. A generic scheme according to the present invention is described below, followed by illustrative embodiments of the invention.

The boundary conditions for the magnetic flux density (B) and magnetic field (H) follow the following relationships:

$$B_2Xn=B_1Xn,\ B_2\times n=(\mu_2/\mu_1)B_1\times n$$

or $$H_2Xn=(\mu_1/\mu_2)H_1Xn,\ H_2\times n=H_1\times n$$

If $\mu_1$>>$\mu_2$, the normal component of $H_2$ is much larger than the normal component of $H_1$, as shown in FIG. 3. In the limit ($\mu_1/\mu_2$)64, the magnetic field $H_2$ is normal to the boundary surface, independent of the direction of $H_1$ (barring the exceptional case of $H_1$ exactly parallel to the interface). If the second media is air ($\mu_2$=1), then $B_2=\mu_0H_2$, so that the flux lines $B_2$ will also be perpendicular to the surface. This property is used to produce magnetic fields that are perpendicular to the horizontal plane of the cantilever in a micro-magnetic latching switch and to relax the permanent magnet alignment requirements.

This property, where the magnetic field is normal to the boundary surface of a high-permeability material, and the placement of the cantilever (i.e., soft magnetic) with its horizontal plane parallel to the surface of the high-permeability material, can be used in many different configurations to relax the permanent magnet alignment requirement.

Fabrication of Gold Contacts

The purpose of this invention is to obtain a pure gold-to-gold contact. A major problem with a gold contact is that gold (Au) does not adhere well to some materials. The common practice is to apply a transition layer (hereafter called a "glue" layer), such as titanium (Ti), chromium (Cr), or the like, prior to gold deposition. One problem with using such a glue layer (e.g., Ti) is that it can intermix with Au at the interface to form TiAu, either during the deposition process itself or during subsequent thermal cycles. The TiAu alloy contact is inferior in contact resistance to a gold-to-gold contact. Another problem with using a glue layer, such as chromium, is that during the etching of the glue layer to restore the gold surface, other metals exposed to the etchant can be adversely effected, such as galvanic etching that etches other metals much faster than the glue layer. There are embodiments described herein to fabricate a gold-to-gold contact. One embodiment is to make use of a glue layer, such as titanium, to promote adhesion of the gold metal outside of the contact area. The contact area will be free of the glue layer. Another embodiment uses a glue layer, such as polyimide, without exposing it to oxygen plasma, to maintain good adhesion to the gold layer.

This invention allows gold to adhere to dielectric films, such as silicon dioxide, silicon nitride, silicon oxynitride, polyimide, or other materials. This process allows a device to achieve a gold-to-gold contact for very low contact resistance.

Figure 4:
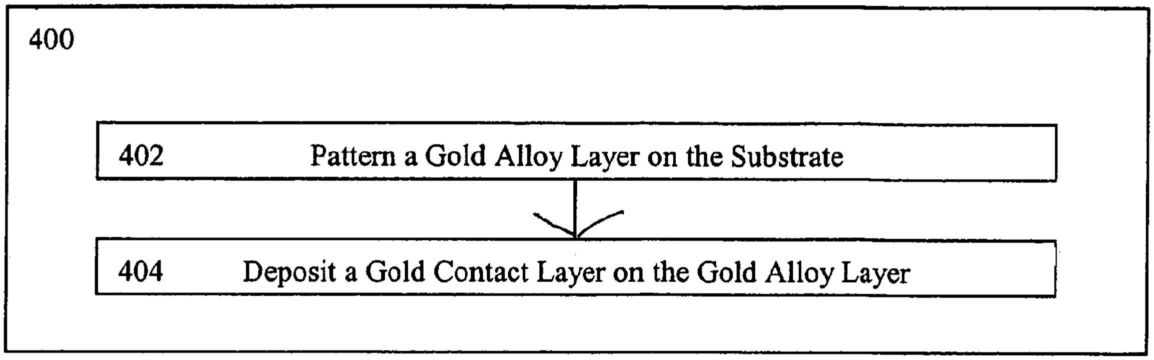
FIG. 4 shows a flow chart of a first method 400 for fabricating a gold contact on a substrate.
Figure 5:
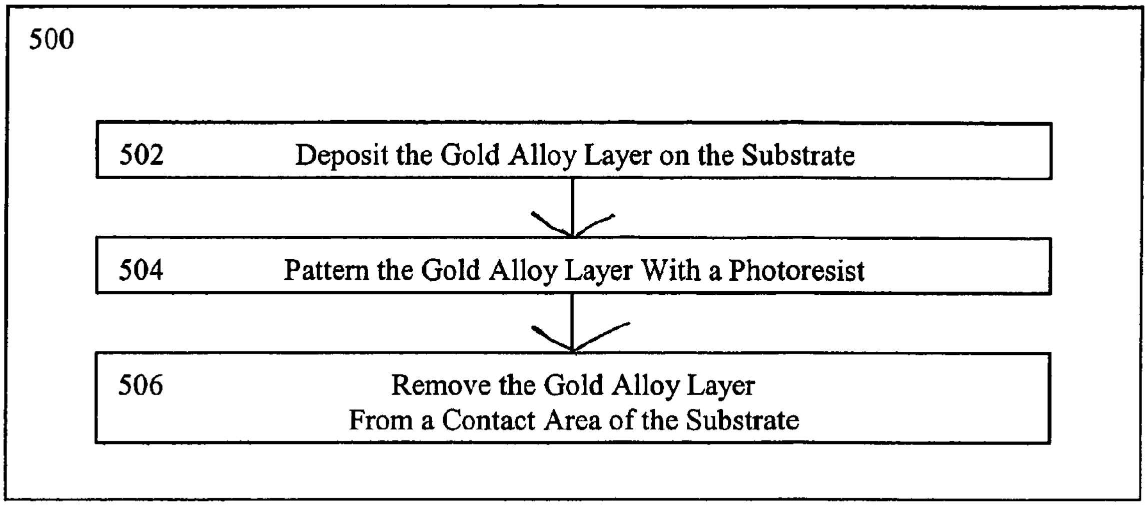
FIG. 5 shows a flow chart of a first method 500 for patterning the gold alloy layer on the substrate.

A first embodiment uses a glue metal layer, such as titanium, to promote adhesion of gold to a material, such as silicon dioxide or other dielectric films. FIG. 4 shows a flow chart of a first method 400 for fabricating a gold contact on a substrate. In method 400, at a step 402, a gold alloy layer is patterned on the substrate. FIG. 5 shows a flow chart of a first method 500 for patterning the gold alloy layer on the substrate. In method 500, at a step 502, the gold alloy layer is deposited on a substrate. At a step 504, the gold alloy layer is patterned with a photoresist. At a step 506, the gold alloy layer is removed from a contact area of the substrate. The gold alloy layer can be removed from the contact area of the substrate by wet etching, dry etching, or another removal means as would be known to one of skill in the art. Alternatively, the gold alloy layer can be deposited on the substrate via a second method using a photoresist assisted lift-off process.

Figure 6:
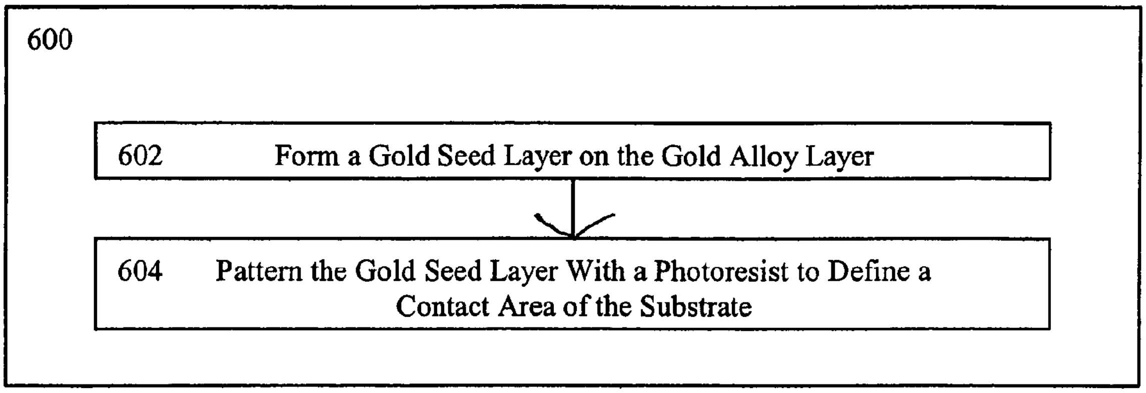
FIG. 6 shows a flow chart of a first method 600 for depositing the gold contact layer on the gold alloy layer.
Figure 7:
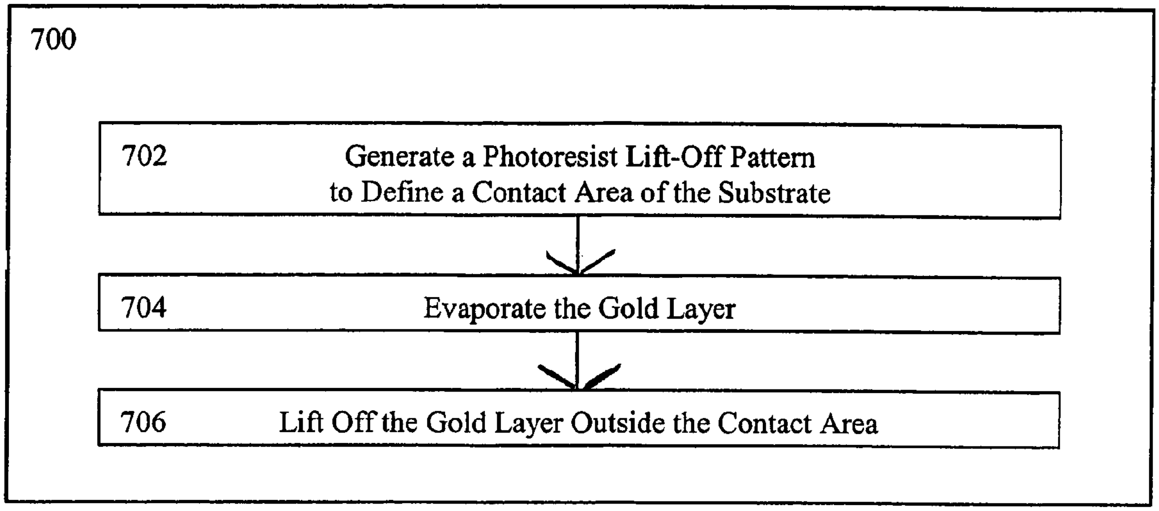
FIG. 7 shows a flow chart of a second method 700 for depositing the gold contact layer on the gold alloy layer.

Returning to method 400 at FIG. 4, at a step 404, a gold contact layer is deposited on the gold alloy layer. FIG. 6 shows a flow chart of a first method 600 for depositing the gold contact layer on the gold alloy layer. Method 600 is a plating technique. In method 600, at a step 602, a gold seed layer is formed on the gold alloy layer. At a step 604, the gold seed layer is patterned with a photoresist to define a contact area of the substrate. FIG. 7 shows a flow chart of a second method 700 for depositing the gold contact layer on the gold alloy layer. Method 700 uses thermal evaporation. In method 700, at a step 702, a photoresist lift-off pattern is generated to define a contact area of the substrate. At a step 704, the gold layer is evaporated. At a step 706, the gold layer outside the contact area is lifted off.

Figure 8:
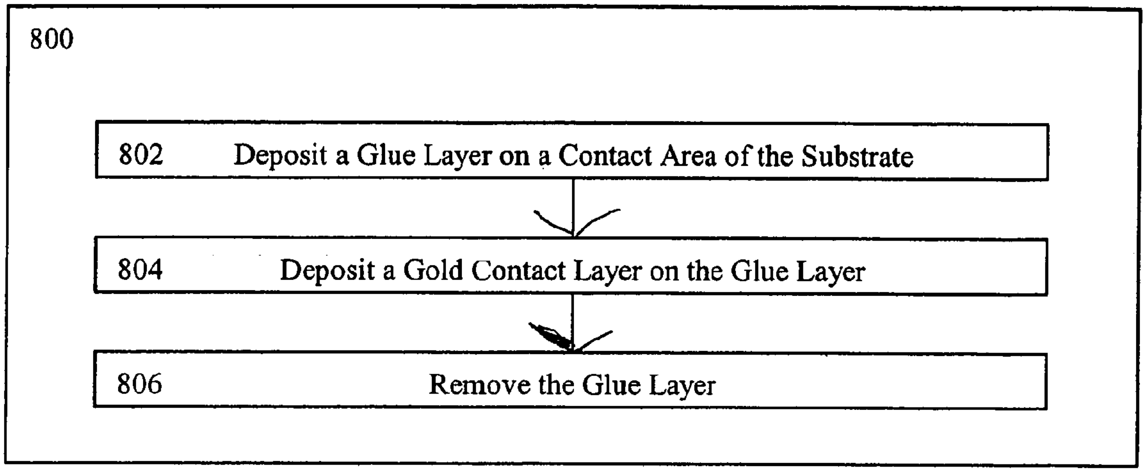
FIG. 8 shows a flow chart of a second method 800 for fabricating a gold contact on a substrate.

A second embodiment uses polyimide as a glue layer. Preferably, the polyimide is not exposed to oxygen plasma prior to gold deposition. FIG. 8 shows a flow chart of a second method 800 for fabricating a gold contact on a substrate. In method 800, at a step 802, a glue layer is deposited on a contact area of the substrate. In an embodiment, the glue is polyimide. At a step 804, a gold contact layer is deposited on the glue layer. The gold contact layer can be formed by plating with a gold seed layer (as described above in method 600 with reference to FIG. 6) or by evaporation of the gold layer with lift-off, as described above with regards to the first embodiment (as described above in method 700 with reference to FIG. 7). At a step 806, the glue layer is removed. The glue layer can be removed using a tetramethylammonium hydroxide (TMAH)-based etchant, plasma etching, or another solvent or removal means as would be known to one of skill in the art.

Figure 9A:
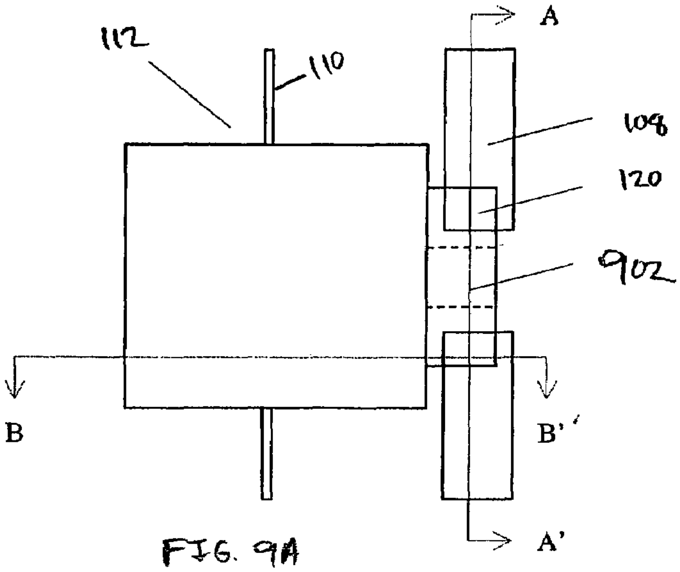
FIGS. 9A through 9C illustrate that the adhesion layer (dashed line) is patterned such that it does not overlap with the bottom contact pads so that it does not need to be removed.
Figure 9B:
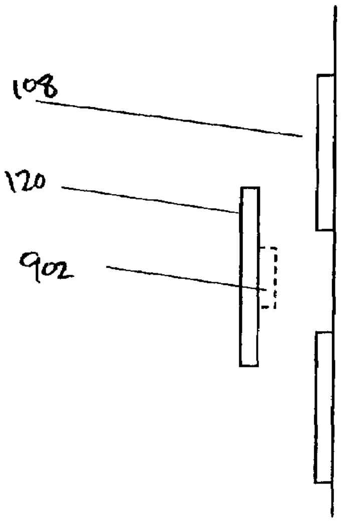
Figure 9C:
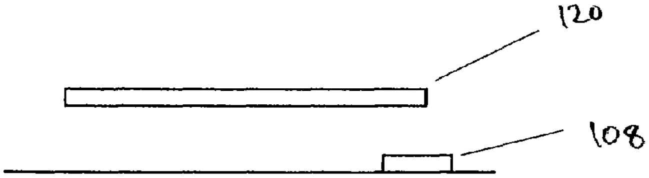

FIGS. 9A through 9C illustrate that the adhesion layer (dashed line) is patterned such that it does not overlap with the bottom contact pads so that it does not need to be removed.

Figure 10:
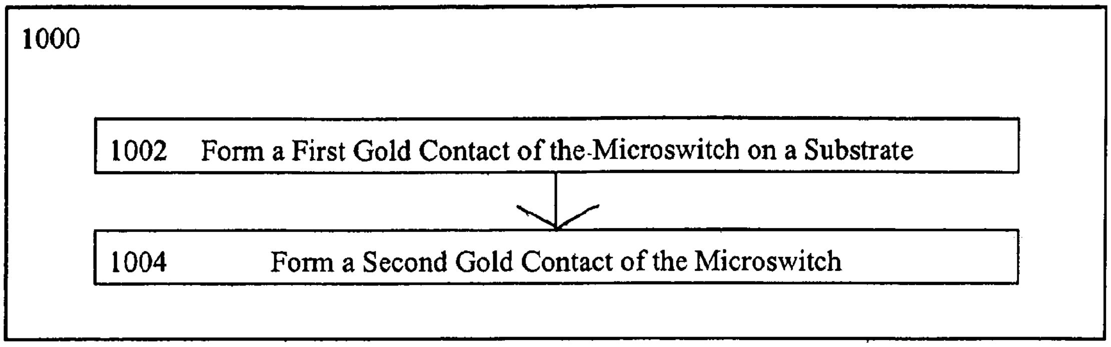
FIG. 10 shows a flow chart of a method 1000 for fabricating gold contacts of a microswitch.

FIG. 10 shows a flow chart of a method 1000 for fabricating gold contacts of a microswitch. In method 1000, at a step 1002, a first gold contact of the microswitch is formed on a substrate. The substrate can comprise silicon, gallium arsenide, quartz, glass, ceramic, polymer, or the like commonly used substrate materials. In an embodiment, the substrate is first coated or deposited with a dielectric material. The first gold contact can comprise a gold alloy. The gold alloy is deposited on the substrate. The gold alloy can be deposited by thermal evaporation, sputtering, or gold plating. In an embodiment, the gold alloy is TiAu.

Figure 11:
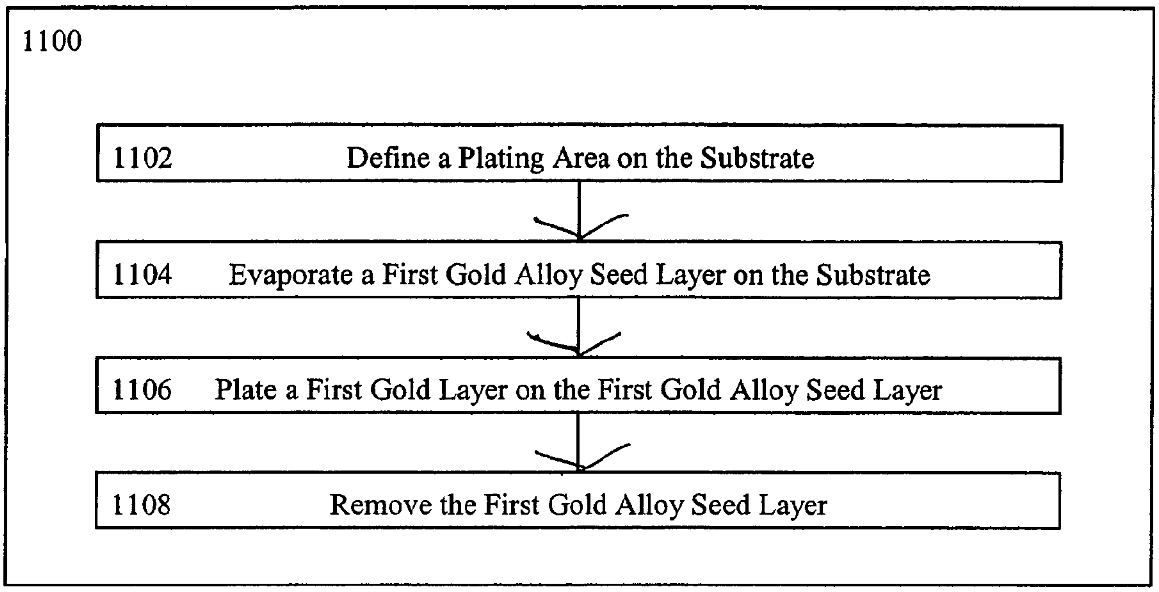
FIG. 11 shows a flow chart of a method 1100 for gold plating the gold alloy on the substrate.
Figure 12:
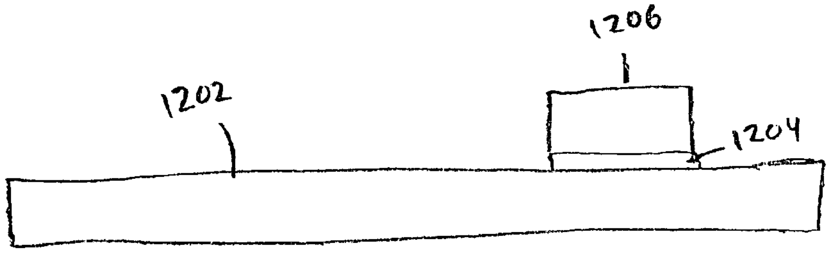
FIG. 12 illustrates a bottom contact 1200 fabricated by method 1100.

FIG. 11 shows a flow chart of a method 1100 for gold plating the gold alloy on the substrate. In method 1100, at a step 1102, a plating area is defined on the substrate. The plating area can be defined with photoresist or other means. At a step 1104, a first gold alloy seed layer is evaporated on the substrate. In an embodiment, the first gold alloy seed layer can comprise 500 Angstroms of titanium and 1,000 Angstroms of gold. At a step 1106, a first gold layer is plated on the first gold alloy seed layer. At a step 1108, the first gold alloy seed layer is removed. The first gold alloy seed layer can be removed by ion milling, etching in solution, or the like. Photoresist, if deposited, can also be removed. FIG. 12 illustrates a bottom contact 1200 fabricated by method 1100. Contact 1200 comprises a substrate 1202, a gold alloy layer 1204, and a plated gold layer 1206. Gold plating is used to ensure sufficient thickness.

Figure 14:
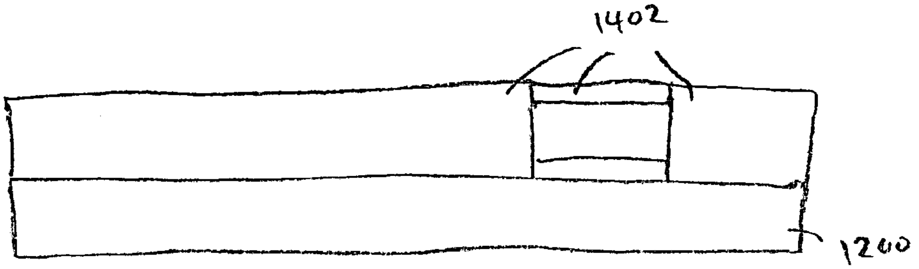
FIG. 14 illustrates bottom contact 1200 with a sacrificial material layer 1402.
Figure 13:
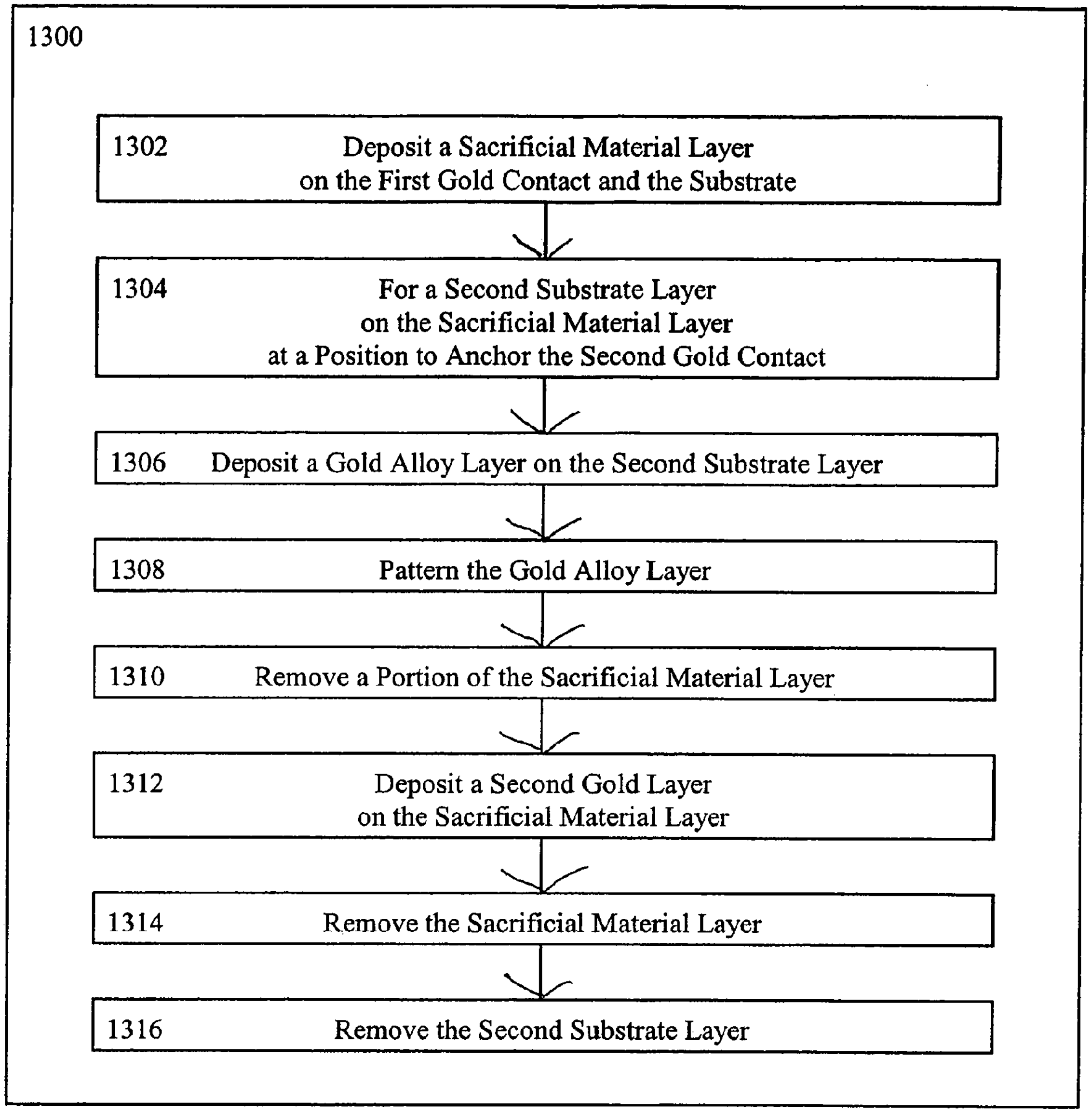
FIG. 13 shows a flow chart of a method 1300 for forming the second gold contact.

Returning to method 1000 at FIG. 10, at a step 1004, a second gold contact of the microswitch is formed. FIG. 13 shows a flow chart of a method 1300 for forming the second gold contact. In method 1300, at a step 1302, a sacrificial material layer is deposited on the first gold contact and the substrate. The sacrificial material can be a dielectric film, silicon dioxide, polyimide, photoresist, or the like. The sacrificial material can be deposited using plasma enhanced chemical vapor deposition (PECVD), sputtering, or other deposition techniques. In an embodiment, the thickness of the sacrificial material can be a few thousand Angstroms or tens of microns. FIG. 14 illustrates bottom contact 1200 with a sacrificial material layer 1402.

Figure 15:
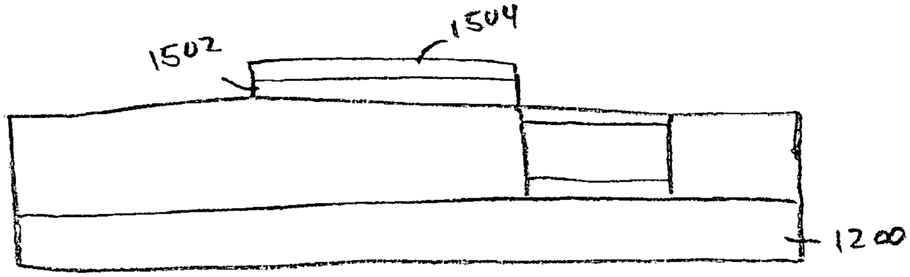
FIG. 15 illustrates bottom contact 1200 with a second substrate layer 1502 and a gold alloy layer 1504.

Returning to method 1300 at FIG. 13, at a step 1304, a second substrate layer is formed on the sacrificial material layer at a position to anchor the second gold contact. In an embodiment, the second substrate layer can be silicon dioxide. At a step 1306, a gold alloy layer is deposited on the second substrate layer. In an embodiment, the gold alloy can be TiAu. In an embodiment, the gold alloy layer can be deposited using thermal evaporation. At a step 1308, the gold alloy layer is patterned. In an embodiment, the gold alloy can be patterned using a lift-off process. At a step 1310, a portion of the sacrificial material is removed. In an embodiment, the portion of the sacrificial material layer can be removed using standard photoresist solvent remover. The gold alloy layer deposited on the portion of the sacrificial material layer is removed; the gold alloy layer deposited on the second substrate layer remains. FIG. 15 illustrates bottom contact 1200 with a second substrate layer 1502 and a gold alloy layer 1504.

Figure 16:
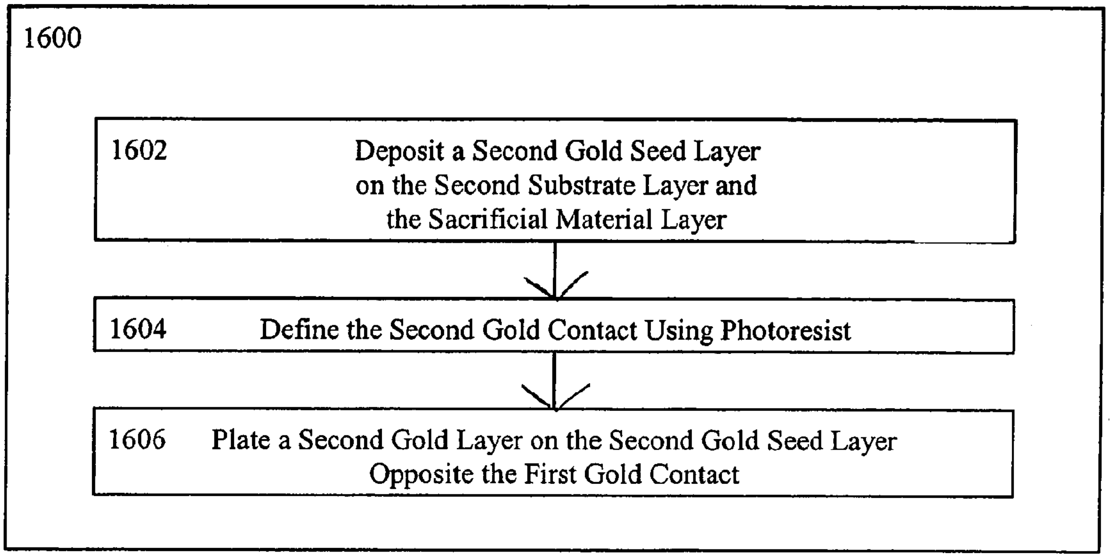
FIG. 16 shows a flow chart of a method 1600 for depositing the second gold layer.
Figure 17:
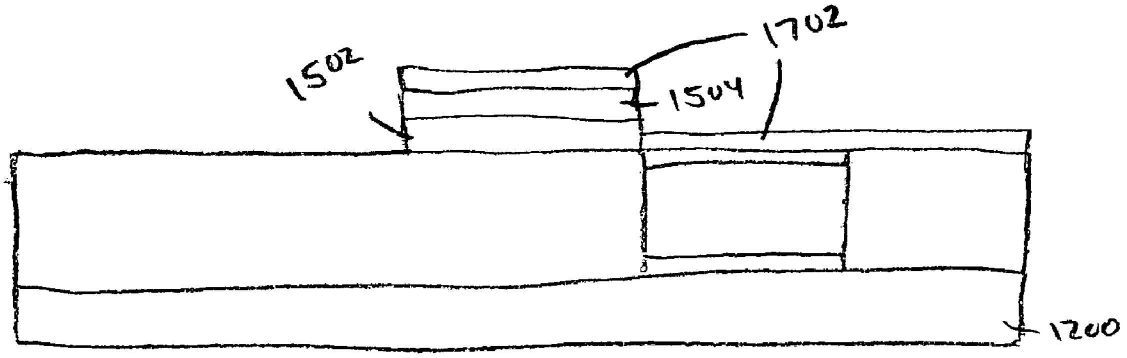
FIG. 17 illustrates bottom contact 1200 with second substrate layer 1502, gold alloy layer 1504, and a second gold seed layer 1702.
Figure 18:
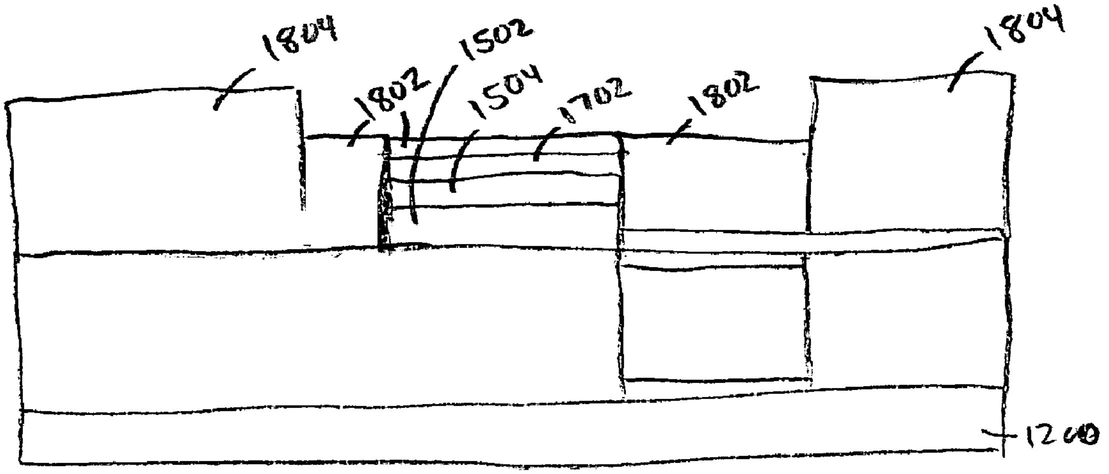
FIG. 18 illustrates bottom contact 1200 with second substrate layer 1502, gold alloy layer 1504, second gold seed layer 1702, a second gold layer 1802, and photoresist 1804.
Figure 19:
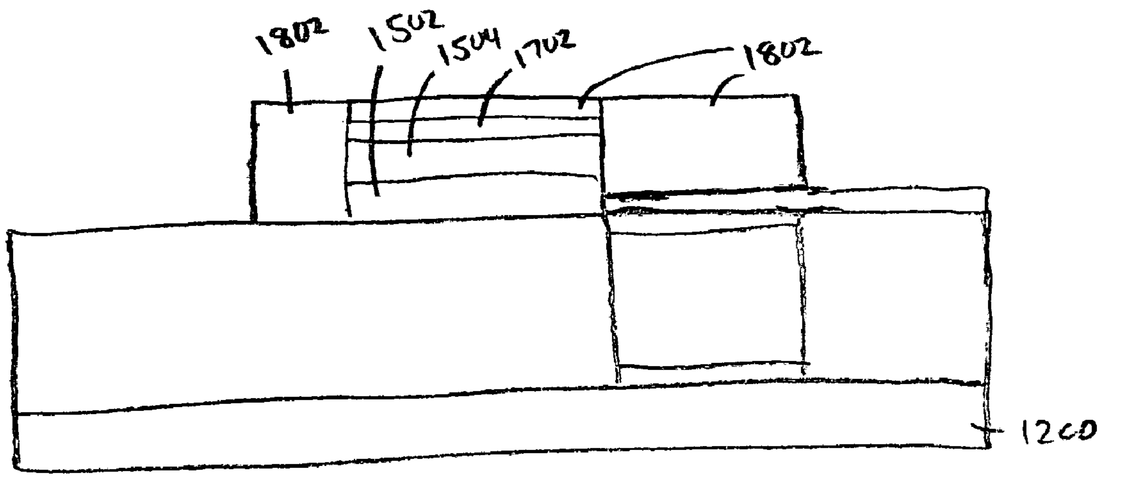
FIG. 19 illustrates bottom contact 1200 with second substrate layer 1502, gold alloy layer 1504, second gold seed layer 1702, second gold layer 1802, but without photoresist 1804.

Returning to method 1300 at FIG. 13, at a step 1312, a second gold layer is deposited on the sacrificial material layer. The second gold layer can be deposited using sputtering or other deposition techniques. FIG. 16 shows a flow chart of a method 1600 for depositing the second gold layer. In method 1600, at a step 1602, a second gold seed layer is deposited on the second substrate layer and the sacrificial material layer. FIG. 17 illustrates bottom contact 1200 with second substrate layer 1502, gold alloy layer 1504, and a second gold seed layer 1702. Returning to method 1600 at FIG. 16, at a step 1604, the second gold contact is defined using photoresist. At a step 1606, a second gold layer is plated on the second gold seed layer opposite the first gold contact. Gold plating is used to ensure sufficient thickness. FIG. 18 illustrates bottom contact 1200 with second substrate layer 1502, gold alloy layer 1504, second gold seed layer 1702, a second gold layer 1802, and photoresist 1804. Returning to method 1600 at FIG. 16, at a step 1608, the photoresist is removed. The photoresist can be removed using standard photoresist solvent remover. At a step 1610, the second gold seed layer is removed from the sacrificial material layer. The second gold seed layer can be removed by wet etching, ion milling, or the like. FIG. 19 illustrates bottom contact 1200 with second substrate layer 1502, gold alloy layer 1504, second gold seed layer 1702, second gold layer 1802, but without photoresist 1804.

Figure 20:
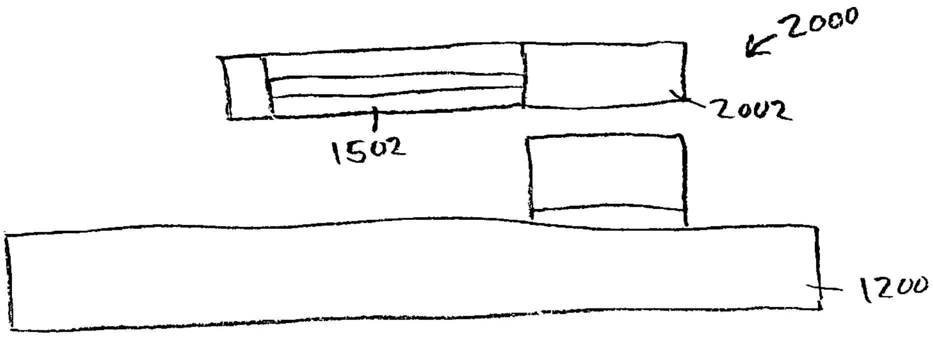
FIG. 20 illustrates bottom contact 1200 and a top contact assembly 2000 with second substrate layer 1502 and a top contact 2002.

Returning to method 1300 at FIG. 13, at a step 1314, the sacrificial material layer is removed. FIG. 20 illustrates bottom contact 1200 and a top contact assembly 2000 with second substrate layer 1502 and a top contact 2002. Returning to method 1300 at FIG. 13, at a step 1316, the second substrate layer is removed. The second substrate layer can be removed using wet or dry etching techniques. Removal of the second substrate layer releases top contact assembly 2000. Advantageously, top contact 2000 is made of gold and not a gold alloy (e.g, AuTi). Advantageously, a portion of top contact assembly 2000 includes a gold alloy (e.g., AuTi). The gold alloy promotes the adhesion of top contact 2002.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for fabricating gold contacts of a microswitch, comprising:

(1) forming a first gold contact of the microswitch on a substrate; and (2) forming a second gold contact of the microswitch, comprising:

(a) depositing a layer of a sacrificial material on the first gold contact and the substrate;

(b) forming a layer of a second substrate on the layer of the sacrificial material at a position to anchor the second gold contact;

(c) depositing a layer of a gold alloy on the layer of the second substrate;

(d) patterning the layer of the gold alloy;

(e) removing a portion of the sacrificial material;

(f) depositing a layer of a gold on the layer of the sacrificial material;

(g) removing at least a portion of the layer of the sacrificial material; and (h) removing at least a portion of the layer of the second substrate.

2. The method of claim 1, wherein the first substrate comprises at least one of a silicon, a gallium arsenide, a quartz, a glass, a ceramic, and a polymer.

3. The method of claim 1, further comprising the step of:

(3) coating the first substrate with a dielectric material.

4. The method of claim 1, further comprising the step of:

(3) depositing a dielectric material on the first substrate.

5. The method of claim 1, wherein the first gold contact comprises a second gold alloy.

6. The method of claim 5, further comprising the step of:

(3) depositing the second gold alloy on the substrate.

7. The method of claim 6, wherein said depositing step comprises the step of gold plating the second gold alloy on the substrate.

8. The method of claim 1, wherein said depositing the layer of the gold alloy step and said patterning step comprise:

(a) generating a photoresist lift-off pattern on the layer of the second substrate to define an area for the second gold contact;

(b) evaporating the first gold alloy for the layer of the first gold alloy; and (c) lifting-off the layer of the first gold alloy outside the area.

9. The method of claim 1, wherein said depositing the layer of the gold step comprises:

(i) depositing a seed layer of the gold on the layer of the second substrate and the layer of the sacrificial material;

(ii) defining, with a photoresist, the second gold contact opposite the first gold contact;

(iii) plating the layer of the gold on the seed layer;

(iv) removing at least a portion of the photoresist; and (v) removing at least a portion of the seed layer from the layer of the sacrificial material.

10. A method, comprising:

(1) forming a first gold contact of a switch on a substrate, wherein the first gold contact comprises a first gold alloy; and (2) forming a second gold contact of the switch, comprising, (a) depositing a layer of a sacrificial material on the first gold contact and the substrate, (b) forming a layer of a second substrate on the layer of the sacrificial material operatively configured to anchor the second gold contact, (c) depositing a layer of a second gold alloy on the layer of the second substrate, (d) patterning the layer of the second gold alloy, (e) removing a portion of the sacrificial material, (f) depositing a layer of gold on the layer of the sacrificial material, (g) removing at least a portion of the layer of the sacrificial material, and (h) removing at least a portion of the layer of the second substrate; and (3) depositing the first gold alloy on the substrate, comprising, gold plating the first gold alloy on the first substrate, comprising, (i) defining a plating area on the first substrate, (ii) evaporating a seed layer of the first gold alloy on the first substrate, (iii) plating a second layer of a gold on the seed layer, and (iv) removing at least a portion of the seed layer.

11. A method, comprising:

(1) forming a first gold contact of a switch directly on a substrate; and (2) forming a second gold contact of the switch, comprising, (a) depositing a layer of a sacrificial material on the first gold contact and the substrate, (b) forming a layer of a second substrate on the layer of the sacrificial material operatively configured to anchor the second gold contact, (c) depositing a layer of a gold alloy on the layer of the second substrate, (d) patterning the layer of the gold alloy, (e) removing a portion of the sacrificial material, (f) depositing a layer of gold on the layer of the sacrificial material, (g) removing at least a portion of the layer of the sacrificial material, and (h) removing at least a portion of the layer of the second substrate.

* * * * *